United States Patent

[11] 3,607,469

[72] Inventors Lee P. Madden
Sunnyvale, Calif.;
[21] Appl. No. 811,116
[22] Filed Mar. 27, 1969
[45] Patented Sept. 21, 1971
[73] Assignees National Semiconductor Corp.
Santa Clara, Calif.;

[54] METHOD OF OBTAINING LOW CONCENTRATION IMPURITY PREDEPOSITION ON A SEMICONDUCTIVE WAFER
18 Claims, 10 Drawing Figs.

[52] U.S. Cl. ........ 148/186, 148/187, 148/188
[51] Int. Cl. ........ H01l 7/34,
[50] Field of Search ........ 148/186, 187, 188

[56] References Cited

UNITED STATES PATENTS

| | | | |
|---|---|---|---|
| 3,019,142 | 1/1962 | Leinkam | 148/188 |
| 3,303,070 | 2/1967 | Schmidt et al. | 148/187 |
| 3,328,216 | 6/1967 | Brown et al. | 148/187 |
| 3,345,275 | 10/1967 | Schmidt et al. | 148/187 |
| 3,391,035 | 7/1968 | Mackintosh | 148/189 |

*Primary Examiner*—L. DeWayne Rutledge
*Assistant Examiner*—R. A. Lester
*Attorneys*—Harvey G. Lowhurst,

ABSTRACT: A method for predepositing very low concentrations of impurity on a semiconductive wafer essentially comprising the steps of immersing the wafer in a nonoxidizing acid solution to remove the oxide from predetermined surface areas of the chip to render those areas highly reactive, and immersing the wafer into an oxidizing solution having a controlled concentration of impurity material therein to cause a new layer of impurity impregnated oxide to be grown over the preselected surface areas. The wafer may then be heated in a diffusion oven to cause the predeposited impurities to be driven from the oxide into the surface of the wafer.

INVENTOR.
LEE P. MADDON
BY Harvey J. Lawhurst
ATTORNEY

METHOD OF OBTAINING LOW CONCENTRATION IMPURITY PREDEPOSITION ON A SEMICONDUCTIVE WAFER

BACKGROUND OF THE INVENTION

The present invention relates generally to semiconductor manufacturing techniques and, more particularly, to a method for controllably and reproducibly obtaining a low concentration predeposition of impurity atoms onto silicon.

Impurity predeposition onto a semiconductive substrate is typically accomplished by placing the substrate in a heated furnace and causing the impurity to be carried to the wafer in a gas stream. These "open tube" predepositions are generally carried out at temperatures between 800° C. and 1,300° C. The concentrations of impurity which can be obtained using this method of predeposition vary with the type of impurity which is suspended in vaporized form in the gas stream but rarely give uniform and reproducible results at surface concentrations of lower than $1\times10^{18}$ atoms per cubic centimeter. For example, using phosphorous impurities, a controllable surface concentration of perhaps as low as $1\times10^{19}$ atoms per cubic centimeter can be obtained, but as one attempts to lower the concentration below that level, the predeposition itself becomes more irregular and erratic and thus the subsequent diffusion cannot be accurately controlled. Similarly, it is very difficult to obtain antimony predepositions below about $1\times10^{18}$ atoms per cubic centimeter using furnace techniques. Other impurities such as boron, aluminum and gallium can also be similarly predeposited and subsequently diffused but are likewise limited to concentrations above $1\times10^{18}$ atoms per cubic centimeter.

Certain other techniques are also occasionally employed. One of these involves the placing of a heavy deposit of the impurity directly upon the wafers at room temperature by means of plating, evaporation or paint-on techniques. The wafers are then heated and the impurities caused to diffuse into the wafer directly from this deposit. However, these techniques are rarely used for integrated circuit processing because of the surface damage which usually results from such heavy deposits.

As integrated circuit technology advances, it has become desirable to provide surface concentrations of less than the present lower limit of $1\times10^{18}$ atoms per cubic centimeter. Such lower concentrations are useful, for example, to provide invention protection layers in the field regions of semiconductive devices and to provide *n*-depletion channels for MOS FET devices.

OBJECTS OF THE INVENTION

It is therefore a principal object of the present invention to provide a novel method for producing low impurity concentration predeposition regions in semiconductive structures.

Another object of the present invention is to provide a novel method for predepositing impurities in low concentration semiconductive devices.

Still another object of the present invention is to provide a novel method of predeposition and diffusion to obtain extremely low concentrations of impurity atoms in surface regions of semiconductive devices.

SUMMARY OF THE PRESENT INVENTION

The present invention relates to a method for predepositing very low concentrations of impurity on a semiconductive wafer. The method comprises the steps of (1) immersing the semiconductive wafer in a nonoxidizing acid solution to remove the oxide from predetermined surface areas of the wafer to render those areas highly reactive, (2) rinsing the reactive surfaces in deionized water, then (3) immersing the wafer into an oxidizing solution having a controlled concentration of impurity material therein to cause a new layer of impurity impregnated oxide to be grown thereon. The wafer may then be heated in a diffusion over to cause the predeposited impurities to be driven from the oxide into the surface of the wafer.

Although the principal advantage of this method relates to the ability to obtain very low surface concentration of impurity, other advantages of this technique over prior art methods will be readily apparent to those of skill in the art after having read the following disclosure of an exemplary but specific technique which is illustrated in the several figures of the drawing.

IN THE DRAWING

DETAILED DESCRIPTION OF THE INVENTIVE METHOD

Figures 1, 2, 3, 4, 5, 6, 7, 8, 9, 10:
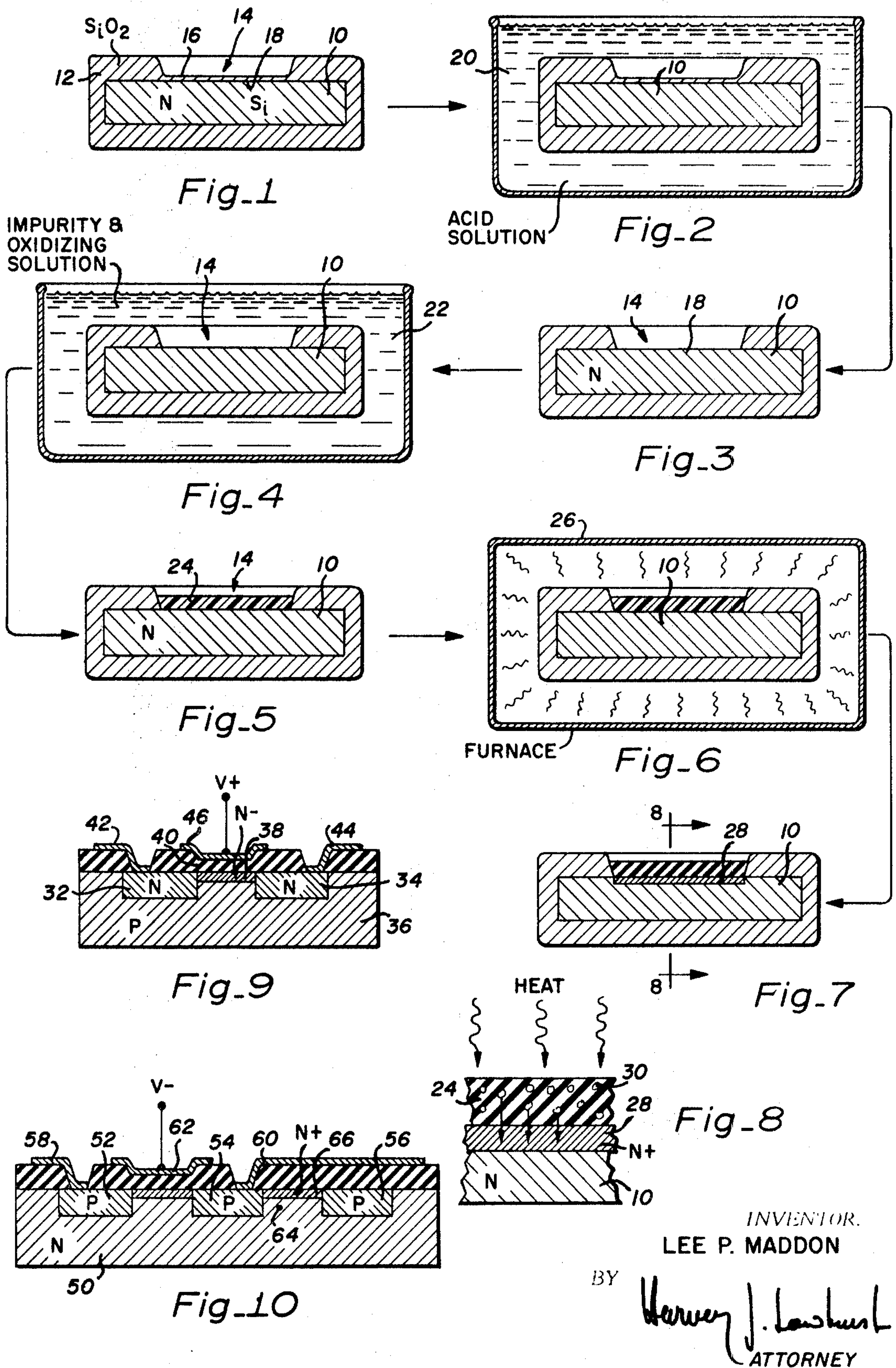
FIGS. 1 through 7 illustrate a novel predeposition and diffusion method in accordance with the present invention.
FIG. 8 illustrates the manner in which the impurities are driven into the semiconductive substrate.
FIG. 9 is a MOS FET structure having a depletion *n*-channel provided in accordance with the present invention.
FIG. 10 is a MOS FET structure having a field inversion protection layer provided in accordance with the present invention.

The surface of a silicon wafer that has just been dipped in a hydrofluoric acid solution is a reactive surface which will rapidly grow an oxide ($SiO_2$) layer if immersed in an oxidizing acid. If compounds of an *n*-type impurity such as antimony or arsenic are dissolved in the oxidizing acid, these impurity atoms will be incorporated into the grown oxide.

Control of the impurity incorporation can be achieved by several methods. An effective method is to immerse the silicon wafers in a pure oxidizing acid after the hydrofluoric acid dip, but prior to immersion in the doped acid solution. The longer the immersion time in pure oxidizing acid the lower the concentration of impurity atoms incorporated from the doped acid.

Control can also be achieved by changing the concentration of the impurity compound in the oxidizing acid. For example, in a saturated solution of antimony trioxide ($Sb_2O_3$) in concentrated sulfuric acid ($H_2SO_4$), the temperature of the solution alone determines the amount of $Sb_2O_3$ that will dissolve in it. This provides a convenient means of preparing identical batches of doping solutions at different times as well as providing a means of controlling the impurity incorporation. The higher the temperature of the saturated doping solution when immersing the silicon wafers, the higher the concentration of incorporated impurity atoms from the doped acid.

A typical predeposition schedule is as follows, dip silicon wafers in a solution of 10 parts deionized water to 1 concentrated hydrofluoric acid for 1 minute; rinse wafers in running deionized water for 2 minutes; boil wafers in deionized water for 2 minutes; immerse wafers in pure concentrated nitric acid for 10 seconds; then immediately transfer and totally immerse the wafers in the doping solution.

After 10 minutes, the wafers are removed from the doping solution and are rinsed in running deionized water for 10 minutes, followed by 10 minutes of boiling in deionized water to remove all traces of the impurity that are not bound in the oxide. The wafers are then blown dry with clean-filtered nitrogen and are thereafter ready for a subsequent diffusion or oxidation at which time the impurity atoms or ions incorporated in the oxide are driven into the silicon.

The doping solution is previously prepared by adding to concentrated sulfuric acid an amount of antimony trioxide in excess of that amount which will dissolve in the acid at 150° C.

The final concentration of the impurity in the silicon (after a subsequent oxidation of 3 hours at 1,200° C. in wet oxygen) is in the range of $1\times10^{16}$ atoms per cubic centimeter. This concentration can be varied over the range of at least $1\times10^{15}$ to $1\times10^{17}$ atoms per cubic centimeter by the methods of control listed above. Over this range, the predepositions are uniform and reproducible.

The concentration of a predeposition performed in accordance with the above described method can be confirmed by at least three different methods. The first is to measure the break down voltage of a $p$-type junction diffused into an $n$-type silicon substrate with this type of predeposition of an $n$-type impurity on the surface. The second method is to obtain capacitance-voltage inversion point measurements of metal oxide semiconductor ring dots. And lastly, the concentration can be confirmed by making sheet resistance and junction depth measurements of this type of predeposition ($n$-type) into a high resistivity $p$-type silicon substrate.

Reference is now made to FIGS. 1 through 7 of the drawing which graphically illustrate a use of the method the present invention. More particularly in FIG. 1 of the drawing, there is shown for illustrative purposes a cross section taken through a chip 10 of $n$-type semiconductive material having an oxide layer 12 grown over the surface thereof. A selected region 14 has been previously etched away to expose the surface 18 but, since an exposed surface of a silicon wafer is highly reactive in air, even at room temperature, a thin oxide layer 16 of several hundred angstroms thickness has inadvertently been built up over the surface of the region 14. This will occur if the wafer is left exposed to air for even a short period of time. It is thus necessary to remove this oxide layer 16 of unknown thickness to again expose the reactive surface 18.

In accordance with the present invention, the chip 10 is immersed in an acid solution as illustrated in FIG. 2 for approximately 1 minute so as to remove the oxide layer 16. As mentioned above, the acid solution 20 is typically a diluted hydrofluoric solution. After the chip 10 is removed from the acid solution 20, it is given a controlled rinsing and cleaning. A typical rinsing and cleaning operation consists of a 2 minute rinse in deionized water followed by a 2 minute boil in deionized water.

Following this operation, the surface 18 of the chip 10 is completely exposed as illustrated in FIG. 3 and is now highly reactive. The chip 10 is then immediately dipped into the doping acid 22. If the solution 22 were a pure oxidizing acid, a pure oxide would simply build up on the surface 18 of the water in the exposed area 14. However, the solution 22 in accordance with the present invention is typically a saturated solution of nitric acid and phosphorous where it is desired to diffuse phosphorous impurities into the wafer 10, or sulfuric acid and antimony trioxide where it is desired that antimony impurities be diffused in the wafer 10.

The wafer 10 is left within the solution 22 for a period of from 2 to 10 minutes so that a doped oxide layer 24 will be formed in the area 14 as illustrated in FIG. 5 of the drawing. The concentration of the impurity ions in the oxide layer 24 is, of course, determined by the concentration of the impurity acid in the solution 22 which was carefully controlled in order to obtain the desired impurity concentration (between $1\times10^{15}$ and $1\times10^{17}$ atoms per cubic centimeter).

As mentioned above the impurity concentration in the oxide layer 24 can also be controlled by a timed immersion of the wafer 10 into a pure oxidizing acid prior to immersion in the doped solution 22.

After removal of the wafer 10 from the doping solution 22, it is rinsed in running deionized water for approximately 10 minutes, followed by boiling in deionized water for approximately 10 minutes to remove all traces of impurity that are not bound within the oxide layer 24. The wafer 10 is then blown dry with clean, filtered nitrogen.

In order to drive the impurities which are contained within the oxide layer 24 into the wafer 10, the wafer is placed into a diffusion oven 26 and is heated to approximately 1,200° C. for a period of from 30 minutes to 2 hours. This causes the impurity ions in the layer 24 to diffuse into the surface of the wafer 10 to a depth of approximately 3 microns to provide an $n+$ region 28 as illustrated in FIG. 7 of the drawing. This operation is perhaps better illustrated in FIG. 8 wherein the oxide layer 24 having the impurity ions 30 suspended therein is shown above the wafer 10. Upon raising the temperature of the wafer and oxide to the diffusion temperature, the impurities 30 being to diffuse into the surface layer 28 of the wafer 10 to provide the desired $n+$ layer 28. The diffusion depth is, of course, a function of the time and temperature and of the initial surface concentration of the doped oxide 24. In accordance with the present invention, the junction depth of the layer 28 will be approximately 1 to 3 microns.

Turning now to FIGS. 9 and 10 of the drawing, examples of the practical use of the thin layer produced in accordance with the present invention will be described. In FIG. 9 there is shown a cross section taken through an MOS FET structure typically referred to as a depletion $n$-channel device. The device is comprised of a pair of $n$-type regions 32 and 34 diffused into a $p$-type wafer 36. The $n$-layer 38 is provided in accordance with the present invention to produce the desired depletion $n$-channel between the source region 32 and the drain region 34. After the region 38 is formed in the channel area, the overlying oxide layer 40 is grown thereover and the source interconnect 42, drain interconnect 44, and gate electrode 46 are formed on the surface of the device. With this device suitably biased, a positive voltage $V^+$ can be applied to the gate 46 to cause the channel 38 to be pinched off to provide the desired field effect operation.

In FIG. 10 another use of a thin layer producible in accordance with the present invention is illustrated. This embodiment is comprised of an $n$-type substrate 50 having $p$-type source and drain regions 52 and 54 respectively, diffused thereinto. In addition, another $p$-region 56 is shown in the right-hand portion of the substrate 50. This region 56 may be a part of a diode, another FET or any other semiconductive element. Source interconnect 58, drain interconnect 60 and gate 62 are shown in their typical form.

As is well known in the art, where a mechanical interconnect passes over a field region such as 64, there is a possibility that the potential applied to the interconnect will cause an inversion of the surface of the field region across which it passes. It will be readily apparent that should this region 64 become inverted, a leakage path would be provided between the drain 54 and the $p$-region 56. Such a spurious current path would obviously produce an unwanted effect on the circuit.

In accordance with the present invention, spurious inversion of the field region can be obviated by providing a thin layer 66 of $n$-type impurities in the region 64 so as to increase the impurity concentration at the surface and thus produce an $n+$ region therein. Since inversion of a surface layer is a function of the concentration gradient in that layer, the increased doping thus provided in the layer 66 will inhibit surface inversion and thereby increase the break down voltage level. The method of the present invention has been found highly suited for providing inversion protection layers such as are illustrated in FIG. 10.

In accordance with the present invention, a novel method of obtaining a predeposition concentration considerably lower than is otherwise obtainable in the prior art has been provided. Although certain type of impurities and chemical solutions have been mentioned in particular, it is to be understood that these are for purposes of illustration only. It is intended that the invention be deemed to include, but not be limited to, solutions containing the donor or acceptor impurities such as gallium, boron, aluminum, bismuth and indium. After having read the above disclosure, it is contemplated that many other uses of the inventive method will be apparent to those of skill in the art. It is therefore to be understood that the method is not intended to be limited to those particular uses described above by way of illustration. Accordingly, I intend that the appended claims be interpreted as covering all variations and uses of the disclosed method which fall within the true spirit and scope of my invention.

What is claimed is:

1. A method of predepositing impurities upon a selected surface area of a semiconductive wafer comprising the steps of:

coating the surface of the wafer with a substantially pure oxide;

removing the oxide overlying said selected surface area of the semiconductive wafer to thereby expose said selected area; and submersing said selected area in an oxidizing solution having a predetermined concentration of semiconductor impurities therein for a predetermined period of time to nonanodically cause the formation of a doped oxide layer over said selected area having said predetermined concentration of semiconductor impurities.

2. A method as recited in claim 1 wherein the concentration of semiconductor impurities in said oxidizing solution is less than $1\times10^{16}$ atoms per cubic centimeter.

3. A method as recited in claim 1 wherein said selected area is subjected to said oxidizing solution from 2 to 10 minutes.

4. A method as recited in claim 1 wherein the concentration of semiconductor impurities in said oxidizing solution is within the range of $1\times10^{15}$ to $1\times10^{18}$ atoms per cubic centimeter.

5. A method of obtaining a low concentration predeposition of impurity atoms on a selected surface area of a silicon wafer at room temperature, comprising the steps of:

coating the entire surface of the wafer with a layer of substantially pure oxide;

removing the portion of the substantially pure oxide layer overlying said selected surface area to expose said selected surface area; and subjecting said selected surface area to an oxidizing solution having a predetermined concentration of impurities therein for a predetermined period of time to cause a doped oxide layer to be nonanodically grown over said selected surface area having said predetermined concentration of impurities suspended therein.

6. A method as recited in claim 5 in which the substantially pure oxide layer portion overlying said selected surface area is removed by submerging in an acid solution and in which said selected surface area so exposed is rinsed and cleaned in deionized water prior to being subjected to said oxidizing solution.

7. A method as recited in claim 6 wherein the concentration of impurities in said oxidizing solution is less than $1\times10^{16}$ atoms per cubic centimeter.

8. A method as recited in claim 5 wherein said oxidizing solution is a mixture of antimony trioxide and sulfuric acid.

9. A method as recited in claim 5 wherein said oxidizing solution is a mixture of phosphoric acid and nitric acid.

10. A method as recited in claim 7 wherein said silicon wafer is subjected to said oxidizing solution for from 2 to 10 minutes.

11. A method as recited in claim 5 wherein said predetermined concentration of impurities in said oxidizing solution is in the range from $1\times10^{15}$ to $1\times10^{18}$ atoms per cubic centimeter.

12. In the process for producing field effect transistors, each having a source region and a drain region defining a channel region therebetween which underlies a gate electrode, the improvement of doping the channel region comprising the steps of:

exposing only the channel region of the otherwise substantially pure oxide coated transistor by cutting a window into the oxide;

subjecting the exposed channel region to an oxidizing solution, having a predetermined concentration of impurities therein, for a predetermined period of time to cause the nonanodic formation of an impurity doped oxide layer over the channel region; and heating said transistor for a predetermined period of time to cause the impurities from said impurity-doped oxide layer to diffuse into the underlying channel region.

13. A method as recited in claim 12 wherein the concentration of impurities in said oxidizing solution is less than $1\times10^{16}$ atoms per cubic centimeter.

14. A method as recited in claim 12 wherein said channel region is subjected to said oxidizing solution from 2 to 10 minutes.

15. A method as recited in claim 12 wherein said oxidizing solution is a mixture of antimony trioxide and sulfuric acid.

16. A method as recited in claim 12 wherein said oxidizing solution is a mixture of phosphoric acid and nitric acid.

17. A method as recited in claim 12 wherein the impurities in said oxidizing solution are selected from the group consisting of antimony, phosphorous, gallium, boron, aluminum, bismuth and indium.

18. A method as recited in claim 12 wherein the predetermined concentration of impurities in said oxidizing solution is in the range from $1\times10^{15}$ to $1\times10^{18}$ atoms per cubic centimeter.